United States Patent
Oikawa et al.

(10) Patent No.: US 10,388,343 B2
(45) Date of Patent: Aug. 20, 2019

(54) MAGNETORESISTIVE ELEMENT AND MAGNETIC MEMORY

(71) Applicant: TOSHIBA MEMORY CORPORATION, Minato-ku, Tokyo (JP)

(72) Inventors: Tadaaki Oikawa, Seoul (KR); Young Min Eeh, Seongnam-si (KR); Kazuya Sawada, Seoul (KR); Kenichi Yoshino, Seongnam-si (KR); Toshihiko Nagase, Tokyo (JP); Daisuke Watanabe, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/917,081

(22) Filed: Mar. 9, 2018

(65) Prior Publication Data

US 2019/0080739 A1   Mar. 14, 2019

(30) Foreign Application Priority Data

Sep. 14, 2017 (JP) ................. 2017-176870

(51) Int. Cl.
| | |
|---|---|
| G11C 11/00 | (2006.01) |
| G11C 11/16 | (2006.01) |
| H01L 27/22 | (2006.01) |
| H01L 43/10 | (2006.01) |
| H01L 43/02 | (2006.01) |
| H01L 43/08 | (2006.01) |
| H01L 43/12 | (2006.01) |

(52) U.S. Cl.
CPC ........ *G11C 11/161* (2013.01); *G11C 11/1675* (2013.01); *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC . G11C 11/161; G11C 11/1675; H01L 27/228; H01L 43/02; H01L 43/08; H01L 43/10; H01L 43/12
See application file for complete search history.

(56) References Cited

U.S. PATENT DOCUMENTS

| | | | |
|---|---|---|---|
| 8,498,148 B2 | 7/2013 | Ranjan et al. | |
| 8,659,103 B2 * | 2/2014 | Watanabe | H01L 27/228 |
| | | | 257/421 |

(Continued)

FOREIGN PATENT DOCUMENTS

| | | |
|---|---|---|
| JP | 2008283207 A | 11/2008 |
| JP | 2015088520 A | 5/2015 |
| TW | 201419598 A | 5/2014 |

*Primary Examiner* — Pho M Luu
(74) *Attorney, Agent, or Firm* — Holtz, Holtz & Volek PC

(57) ABSTRACT

A magnetoresistive element includes: a first magnetic layer having a magnetization direction that is variable; a second magnetic layer having a magnetization direction that is invariable; a first non-magnetic layer provided between the first magnetic layer and the second magnetic layer; a third magnetic layer that fixes the magnetization direction of the second magnetic layer and that antiferromagnetically couples with the second magnetic layer; and a second non-magnetic layer provided between the second magnetic layer and the third magnetic layer. The second non-magnetic layer includes ruthenium (Ru) and a metal element.

13 Claims, 4 Drawing Sheets

(56) References Cited

U.S. PATENT DOCUMENTS

| | | | |
|---|---|---|---|
| 8,670,268 B2 * | 3/2014 | Nagase | H01L 43/08 |
| | | | 257/421 |
| 9,293,695 B2 * | 3/2016 | Ueda | H01L 43/08 |
| 2010/0118600 A1 | 5/2010 | Nagase et al. | |
| 2013/0307102 A1 | 11/2013 | Oh et al. | |
| 2016/0268496 A1 | 9/2016 | Yamane et al. | |

* cited by examiner

| Spacer | Hex slope(0-120) | Hex slope(120-300) |
|---|---|---|
| Ref.Ru | −10.1 | −1.9 |
| RuTa15 | −12.8 | −1.4 |
| RuTa30 | −8.5 | −1.8 |
| RuW15 | −7.4 | −1.5 |
| RuW30 | −6.7 | −1.0 |

US 10,388,343 B2

MAGNETORESISTIVE ELEMENT AND MAGNETIC MEMORY

CROSS-REFERENCE TO RELATED APPLICATIONS

This application is based upon and claims the benefit of priority from Japanese Patent Application No. 2017-176870, filed Sep. 14, 2017, the entire contents of which are incorporated herein by reference.

FIELD

Embodiments described herein relate generally to a magnetoresistive element and a magnetic memory.

BACKGROUND

A magnetoresistive random access memory (MRAM) is known as a type of semiconductor memory device. The MRAM is a memory device that uses a magnetoresistive element, having a magnetoresistive effect, as a memory cell which stores information. Writing methods for MRAMs include a spin-transfer torque writing method. The spin-transfer torque writing method is advantageous in high integration, low power consumption, and high performance, due to the characteristic that the smaller the size of a magnetic body, the smaller the spin-transfer torque current necessary for magnetization inversion.

The magnetoresistive element stores binary data in accordance with a magnetization direction of a storage layer. Therefore, to realize a high-performance MRAM, it is important to improve data storage characteristics of the storage layer.

BRIEF DESCRIPTION OF TEE DRAWINGS

DETAILED DESCRIPTION

In general, according to one embodiment, there is provided a magnetoresistive element comprising:
a first magnetic layer having a magnetization direction that is variable;
a second magnetic layer having a magnetization direction that is invariable;
a first non-magnetic layer provided between the first magnetic layer and the second magnetic layer;
a third magnetic layer that fixes the magnetization direction of the second magnetic layer and that antiferromagnetically couples with the second magnetic layer; and
a second non-magnetic layer provided between the second magnetic layer and the third magnetic layer,
wherein:
the second non-magnetic layer includes ruthenium (Ru) and a metal element; and
the metal element is selected from the group consisting of osmium (Os), rhodium (Rh), palladium (Pd), iridium (Ir), platinum (Pt), chromium (Cr), tungsten (W), tantalum (Ta), niobium (Nb), and molybdenum (Mo).

Hereinafter, the embodiments will be described with reference to the accompanying drawings. In the description below, structural elements having the same configurations will be denoted by the same reference symbols, and a repetitive description of such elements will be given only where necessary. The figures show schematic or conceptual views, and the size and ratio of each figure are not necessarily the same as those of an actual configuration. Each embodiment is an example of an apparatus or a method to embody a technical idea of the embodiment. The technical idea of the embodiment does not specify the material, shape, structure, arrangement, etc. of structural components to those described below.

First Embodiment

A magnetoresistive element included in a magnetic storage device will be explained below. The magnetoresistive element (magnetoresistive effect element) is also called a magnetic tunnel junction (MTJ) element.

[1] Structure of MTJ Element

Figure 1:
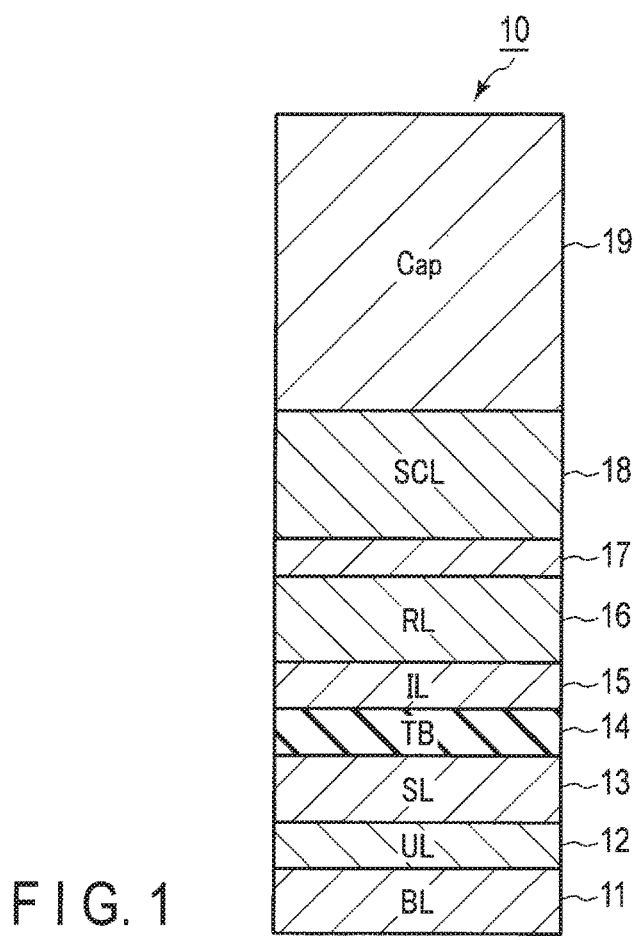
FIG. 1 is a cross-sectional view of an MTJ element according to a first embodiment.

FIG. 1 is a cross-sectional view of an MTJ element 10 according to the first embodiment. The MTJ element 10 shown in FIG. 1 is provided on a base structure (not shown). The base structure includes a semiconductor substrate, a select transistor (MOS transistor), and an interlayer insulating layer. A lower electrode (not shown) is provided on a lower surface of the MTJ element 10. The MTJ element 10 is electrically connected to the select transistor via the lower electrode. An upper electrode (not shown) is provided on an upper surface of the MTJ element 10. The MTJ element 10 is electrically connected to a bit line (not shown) via the upper electrode.

As shown in FIG. 1, the MTJ element 10 includes a buffer layer (BL) 11, an underlying (UL) layer 12, a storage layer (SL) 13, a tunnel barrier layer (TB) 14, an interface layer (IL) 15, a reference layer (RL) 16, a spacer layer 17, a shift cancelling layer (SCL) 18, and a cap layer (Cap) 19, which are layered in this order from bottom to top. The storage layer 13 is also called a free layer. The reference layer 16 is also called a fixed layer. The shift cancelling layer 18 is also called a shift adjustment layer. A planer shape of the MTJ element 10 is not specifically limited; it is, for example, a circle or an ellipse.

The buffer layer 11 includes, aluminum (Al), beryllium (Be), magnesium (Mg), calcium (Ca), strontium (Sr), barium (Ba), scandium (Sc), yttrium (Y), lanthanum (La), silicon (Si), zirconium (Zr), hafnium (Hf), tungsten (W), chromium (Cr), molybdenum (Mo), niobium (Nb), titanium (Ti), tantalum (Ta), vanadium (V), or the like. The buffer layer 11 may include a boride of these elements. The boride is not limited to a binary compound made of two kinds of elements, but may be a ternary compound made of three kinds of elements. For example, the buffer layer 11 may include hafnium boride (HfB), magnesium aluminum boride (MgAlB), hafnium aluminum boride (HfAlB), scandium aluminum boride (ScAlB), scandium hafnium boride (ScHfB), or hafnium magnesium boride (HfMgB). Alternatively, these materials may be layered. By using a high-melting-point metal or boride thereof, it is possible to prevent a material of the buffer layer from diffusing to a magnetic layer and to prevent degradation of a magnetoresistance ratio (MR ratio). In this description, the high-melting-point metal refers to a material having a melting point higher than that of iron (Fe) and cobalt (Co); for example, zirconium (Zr), hafnium (Hf), tungsten (W), chromium (Cr), molybdenum (Mo), niobium (Nb), titanium (Ti), tantalum (Ta), vanadium (V), or an alloy thereof.

The underlying layer 12 is a layer to control crystallinity, a grain size, etc. of the storage layer. The underlying layer 12 includes a nitrogen compound or an oxygen compound, such as magnesium oxide (MgO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The underlying layer 12 may include a nitrogen compound or an oxygen compound including two of magnesium (Mg), zirconium (Zr), niobium (Nb), silicon (Si), aluminum (Al), hafnium (Hf), tantalum (Ta), tungsten (W), chromium (Cr), molybdenum (Mo), titanium (Ti), and vanadium (V). In other words, the underlying layer 12 may include not only a binary compound made of two kinds of elements, but also a ternary compound made of three kinds of elements, such as aluminum titanium nitride (AlTiN). A nitrogen compound and an oxygen compound suppress an increase of a damping constant of a magnetic layer in contact with these compounds, and can achieve an effect of reducing a write current. Furthermore, by using a nitrogen compound or an oxygen compound that is a high-melting-point metal, it is possible to prevent a material of the underlying layer from diffusing to a magnetic layer and to prevent degradation of an MR ratio.

The storage layer 13 is formed of a ferromagnetic material. The storage layer 13 has, for example, perpendicular magnetic anisotropy, and its easy-to-magnetize direction is perpendicular or almost perpendicular to a film surface. Being "almost perpendicular" includes a case that a remanent magnetization direction falls within the range of $45<\theta\leq90°$ with respect to a film surface. The magnetization direction of the storage layer 13 is variable, and invertible. The term "variable magnetization direction" means that the magnetization direction of the storage layer 13 can vary when a predetermined write current flows through the MTJ element 10.

The storage layer 13 is made of a compound or alloy including iron (Fe) and boron (B). The storage layer 13 may include cobalt (Co) in addition to iron (Fe) and boron (B). For example, the storage layer 13 is made of cobalt iron boron (CoFeB) or iron boride (FeB).

The tunnel barrier-layer 14 is made of a non-magnetic material. The tunnel barrier layer 14 functions as a barrier between the storage layer 13 and the interface layer 15. For example, the tunnel barrier layer 14 is made of an insulating material, and specifically includes magnesium oxide (MgO).

The interface layer 15 magnetically couples with the reference layer 16. The interface layer 15 is made of a ferromagnetic material that has, for example, a high polarization ratio. The MTJ element 10 including the interface layer 15 can produce a large tunneling magneto resistive (TMR) effect. The interface layer 15 is preferably made of a material having a small degree of lattice mismatch with the tunnel barrier layer 14. The interface layer 15 includes, for example, cobalt iron boron (CoFeB) or iron boride (FeB).

The interface layer 15 and the reference layer 16 may be collectively referred to as a reference layer.

The reference layer 16 is made of a ferromagnetic material. The reference layer 16 has, for example, perpendicular magnetic anisotropy, and its easy-to-magnetize direction is almost perpendicular to a film surface. The magnetization direction of the reference layer 16 is invariable, that is, fixed to one direction. The term "invariable magnetization direction" means that the magnetization direction of the reference layer 16 does not vary when a predetermined write current flows through the MTJ element 10.

The reference layer 16 is made of a compound or alloy including iron (Fe) and boron (B). The reference layer 16 may include cobalt (Co) in addition to iron (Fe) and boron (B). For example, the reference layer 16 is made of cobalt iron boron (CoFeB) or iron boride (FeB). Alternatively, the reference layer 16 includes an artificial lattice film formed by layering cobalt (Co) and one of platinum (Pt), nickel (Ni), and palladium (Pd), or an alloy film formed of Co and one of Pt, Ni, and Pd. Specifically, a film formed by layering a magnetic layer and a non-magnetic layer, such as a Co/Ni film, a Co/Pt film or a Co/Pd film, may be used as the artificial lattice film. Alternatively, a cobalt platinum (CoPt) film, a cobalt nickel (CoNi) film, or a cobalt palladium (CoPd) film may be used as the alloy film.

The spacer layer 17 is made of a non-magnetic material, and has a function of antiferromagnetically coupling the reference layer 16 and the shift cancelling layer 18. In other words, the reference layer 16, the spacer layer 17, and the shift canceling layer 18 form a synthetic antiferromagnetic (SAF) structure. The reference layer 16 and the shift cancelling layer 18 are antiferromagnetically coupled via the spacer layer 17. The spacer layer 17 is made of an alloy including ruthenium (Ru). A specific configuration of the spacer layer 17 will be described later.

The shift cancelling layer 18 has a function of reducing a leak field leaked from the reference layer 16, and preventing the leak field from being applied to the storage layer 13, thereby preventing a magnetic coercive force (or a magnetization curve) of the storage layer 13 from shifting. The shift cancelling layer 18 is made of a ferromagnetic material. The shift cancelling layer 18 has, for example, perpendicular magnetic anisotropy, and its easy-to-magnetize direction is almost perpendicular to a film surface. The magnetization direction of the shift cancelling layer 18 is invariable, that is, fixed to one direction. The magnetization directions of the shift cancelling layer 18 and the reference layer 16 are antiparallel. The shift cancelling layer 18 is made of a ferromagnetic material that is, for example, the same as the reference layer 16. The shift cancelling layer 18 may be formed of a material different from the reference layer 16 and selected from the ferromagnetic materials enumerated above as the material of the reference layer 16. The magnetization directions of the storage layer 13, the reference layer 16, and the shift cancelling layer 18 are not limited to perpendicular, but may be in an in-plane direction.

The cap layer 19 is a non-magnetic conductive layer, and includes platinum (Pt), tungsten (W), tantalum (Ta), or ruthenium (Ru), for example.

Data can be written to and read from the MTJ element 10 by the spin-transfer torque writing method. In the spin-transfer torque writing method, a write current directly flows in the MTJ element 10, and the magnetization state of the MTJ element 10 is controlled by the write current. The MTJ element 10 can be brought into either a low-resistance state and a high-resistance state depending on whether the relative relationship between the storage layer 13 and the reference layer 16 is parallel or antiparallel. In other words, the MTJ element 10 is a variable resistance element.

When a write current directed to the reference layer 16 from the storage layer 13 flows in the MTJ element 10, the relative relationship between the storage layer 13 and the reference layer 16 is parallel. In the parallel state, the resistance value of the MTJ element 10 is the lowest, and the MTJ element 10 is set to a low-resistance state. The low-resistance state of the MTJ element 10 is defined as, for example, data "0".

On the other hand, when a write current directed to the storage layer 13 from the reference layer 16 flows in the MTJ element 10, the relative relationship between the storage layer 13 and the reference layer 16 is antiparallel. In the antiparallel state, the resistance value of the MTJ element 10 is the highest, and the MTJ element 10 is set to a high-resistance state. The high-resistance state of the MTJ element 10 is defined as, for example, data "1".

Thus, the MTJ element 10 can be used as a storage element capable of storing 1-bit data (binary data). The resistance states of the MTJ element 10 can be discretionarily allocated to any data.

When data is read from the MTJ element 10, a read voltage is applied to the MTJ element 10, and a resistance value of the MTJ element 10 is detected by a sense amplifier or the like based on a read current flowing through the MTJ element 10 at that time. The read current is set to a value sufficiently smaller than a threshold for magnetization inversion by a spin-transfer torque.

[2] SAF Structure

The SAF structure formed of the reference layer 16, the spacer layer 17, and the shift cancelling layer 18 will be described more specifically.

Figure 2:
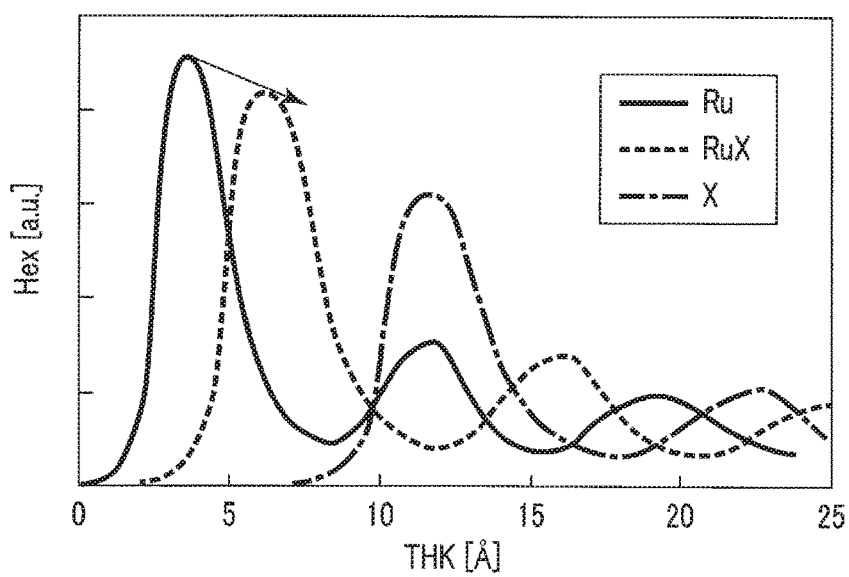
FIG. 2 is a graph illustrating an exchange coupling magnetic field Hex in a spacer layer.

FIG. 2 is a graph illustrating an exchange coupling magnetic field Hex in the spacer layer 17. In FIG. 2, the horizontal axis represents a thickness THK (angstrom) of the spacer layer 17, and the vertical axis represents an exchange coupling magnetic field Hex (arbitrary unit: a.u.) in the spacer layer 17.

The solid line in FIG. 2 is a graph representing a case of using Ru alone as the spacer layer. The exchange coupling magnetic field Hex has a waveform characteristic, and a crest value (peak) of the characteristic lowers as the thickness THK increases. In other words, the exchange coupling magnetic field Hex has a plurality of peaks. The greater the thickness THK, the lower the peak. The highest peak where the exchange coupling magnetic field Hex is the largest is referred to as a first peak, and the second highest peak where the exchange coupling magnetic field Hex is the second largest is referred to as a second peak.

To obtain a large exchange coupling magnetic field Hex in the Ru spacer layer, it is necessary to apply conditions for the smallest thickness for the first peak. However, the thickness corresponding to conditions for the spacer layer is very thin, atomic diffusion due to application of an external temperature largely affects the spacer layer. As a result, the thermal endurance of magnetic characteristics deteriorates.

In this embodiment, the spacer layer 17 antiferromagnetically coupling the reference layer 16 and the shift cancelling layer 18 is formed of an alloy of ruthenium (Ru) and a metal X. An alloy containing ruthenium (Ru) is referred to as the RuX alloy (ruthenium-based alloy). FIG. 2 also show graphs representing cases of the RuX alloy and the metal X alone as the spacer layer 17.

The metal (metal element) X is selected from the group consisting of osmium (Os), rhodium (Rh), palladium (Pd), iridium (Ir), platinum (Pt), chromium (Cr), tungsten (W), tantalum (Ta), niobium (Nb), and molybdenum (Mo). Osmium (Os), rhodium (Rh), palladium (Pd), iridium (Ir), and platinum (Pt) belong to a platinum group.

Regarding the platinum group and the RuX alloy containing chromium (Cr), the exchange coupling magnetic field Hex of the spacer layer formed of such a material is deteriorated in comparison with that of Ru alone. However, since the spacer layer that provides the first peak can be thicker than in the case of Ru alone (the influence of the atomic diffusion due to application of an external temperature can be reduced), the thermal endurance of the exchange coupling magnetic field Hex can be improved.

Tungsten (W), tantalum (Ta), niobium (Nb), and molybdenum (Mo) belong to high-melting-point metals. Heat resistance of the RuX alloy can be improved by using a high-melting-point metal as the metal X. Furthermore, since the thickness of the spacer layer that provides the first peak can be thicker than in the case of Ru alone, the heat resistance of the RuX alloy can be improved.

As shown in FIG. 2, the first peak of the RuX alloy is slightly lower than the first peak of Ru alone and higher than the second peak of Ru alone. The thickness of the RuX alloy as the spacer layer 17 is set to the thickness that provides the first peak of the exchange coupling magnetic field Hex of the Rux alloy, or set near the thickness that provides the first peak. The term "near the thickness that provides the first peak" means a range of 80% or more of the crest value of the first peak. Otherwise, the thickness of the RuX is greater than the thickness that provides the first peak of Ru along and smaller than the thickness that provides the second peak of Ru alone.

By using the RuX alloy as the spacer layer 17, the thickness of the spacer layer 17 can be thick, while Hex is maintained to be satisfactorily larger than Hex at the second peak where the spacer is thick in the conventional case of using Ru alone.

Figure 3:
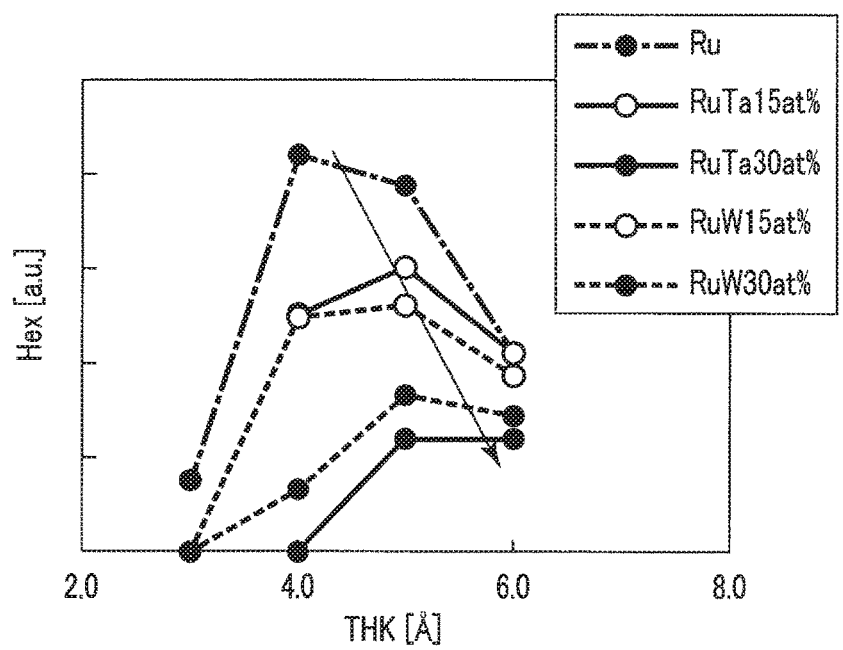
FIG. 3 is a graph illustrating an exchange coupling magnetic field Hex in a plurality of kinds of RuX alloy.

FIG. 3 is a graph illustrating an exchange coupling magnetic field Hex in a plurality of kinds of RuX alloy. In FIG. 3, the horizontal axis represents a thickness THK (angstrom) of the spacer layer 17, and the vertical axis represents an exchange coupling magnetic field Hex (arbitrary unit) in the spacer layer 17. FIG. 3 mainly shows first peaks of exchange coupling magnetic fields Hex in Rux alloys. FIG. 3 shows graphs representing cases of using Ru alone, ruthenium tantalum (RuTa), and ruthenium tungsten (RuW). Specifically, FIG. 3 shows graphs representing cases of using RuTa 15 at % (at %: atomic percent) in which the composition of Ta is 15 at %, RuTa 30 at % in which the composition of Ta is 30 at %, RuW 15 at % in which the composition of W is 15 at %, and RuW 30 at % in which the composition of W is 30 at %.

As shown in FIG. 3, by using the RuX alloy containing RuTa or RuW, the first peak of the exchange coupling magnetic field Hex can be shifted in a direction of increasing the thickness. Accordingly, the thickness of the spacer layer 17 can be increased, while a large exchange coupling magnetic field Hex is maintained. In particular, a large exchange coupling magnetic field Hex can be obtained in the case of using RuTa 15 at % and RuW 15 at %.

Figure 4:
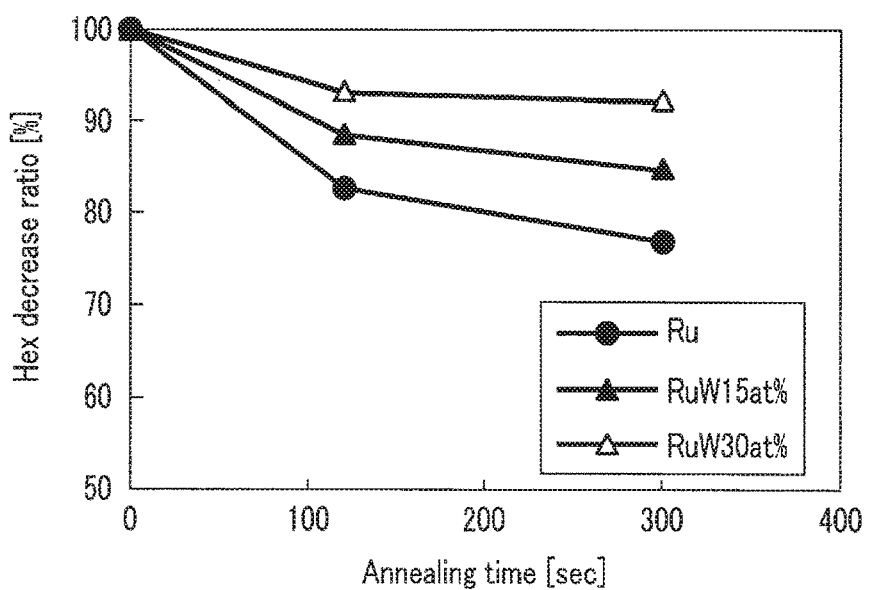
FIG. 4 is a graph illustrating the relationship between a decrease ratio of an exchange coupling magnetic field Hex and an annealing time.

FIG. 4 is a graph illustrating the relationship between a decrease ratio of an exchange coupling magnetic field Hex (Hex decrease ratio) and an annealing time. In FIG. 4, the horizontal axis represents an annealing time (sec), and the vertical axis represents an Hex decrease ratio. FIG. 4 shows graphs of RuW 15 at % and RuW 30 at %, for example, as well as a graph of Ru alone. In a process of manufacturing the MTJ element 10, annealing (heat treatment) is performed a plurality of times for the SAF structure.

As shown in FIG. 4, the Hex decrease ratio of the RuX alloy is smaller than that of Ru alone. Furthermore, the greater the composition of the metal X, the smaller the Hex decrease ratio. Therefore, it is understandable that an Rux alloy should preferably be used in the MTJ element 10 in which annealing is performed a plurality of times at a high temperature.

Figures 5, 6:
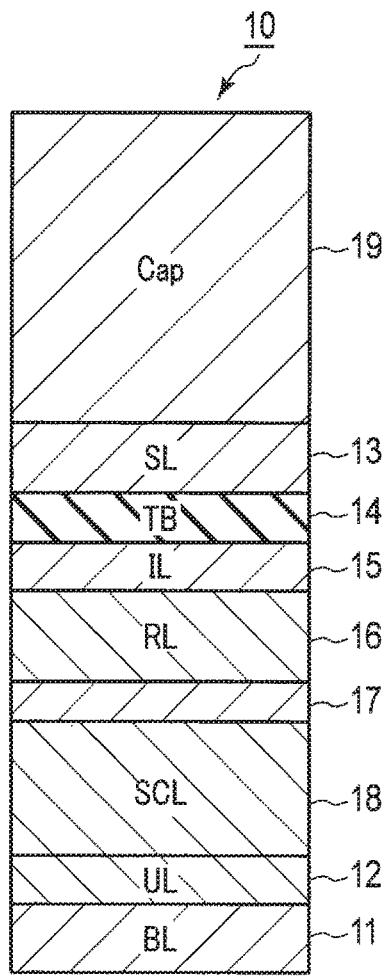
FIG. 5 is a diagram illustrating slopes of an Hex decrease ratio in a plurality of kinds of RuX alloy.
FIG. 6 is a cross-sectional view of an MTJ element according to a second embodiment.

FIG. 5 is a diagram illustrating slopes of an Hex decrease ratio in a plurality of kinds of RuX alloy. FIG. 5 shows values of slopes of Hex decrease ratios in the cases of using Ru alone (Ref. Ru), RuTa 15 at %, RuTa 30 at %, RuW 15 at %, and RuW 30 at %. In FIG. 5, calculated values of slopes in an annealing time of 0 to 120 seconds (slope (0-120)) and slopes in an annealing time of 120 to 300 seconds (slope (120-300)) are separately indicated.

As shown in FIG. 5, the Hex decrease ratio is smaller in an RuX alloy than that in Ru alone. Furthermore, it is understandable that the Hex decrease ratio of RuW is sufficiently small.

In the embodiment described above, the MTJ element 10 has a top SAF structure in which the SAF structure including the reference layer 16 is arranged above the storage layer 13, as shown in FIG. 1. However, the MTJ element 10 is not limited to the structure described above, but may have a bottom SAF structure in which the SAF structure including the reference layer 16 is arranged below the storage layer 13. Specifically, the MTJ element 10 having the bottom SAF structure includes the buffer layer 11, the underlying layer 12, the shift cancelling layer 18, the spacer layer 17, the reference layer 16, the tunnel barrier layer 14, the interface layer 15, the storage layer 13, and the cap layer 19, which are layered in this order from bottom to top. The characteristics of the SAF structure can also be improved in the bottom SAF structure.

[3] Advantage of First Embodiment.

In the case of using ruthenium (Ru) as the non-magnetic layer (spacer) included in the SAF structure, since the spacer thickness at the first peak where the exchange coupling magnetic field Hex is the largest is very thin, the thermal endurance is deteriorated. In the process of manufacturing the MTJ element, annealing at a high temperature is performed a plurality of times. Therefore, it is necessary to improve the thermal endurance of the spacer.

Therefore, in the first embodiment, the MTJ element 10 has the SAF structure formed of the reference layer 16, the spacer layer 17, and the shift cancelling layer 18. In addition, the spacer layer 17 is made of an RuX alloy of ruthenium (Ru) and a metal X.

Therefore, according to the first embodiment, the thickness of the spacer layer 17 can be thick, while Hex is maintained to be satisfactorily larger than Hex at the second peak where the spacer is thick in the conventional case of using Ru alone. Accordingly, it is possible to prevent the field leaked from the reference layer 16 from being applied to the storage layer 13, and to improve the thermal endurance of the spacer layer 17. As a result, magnetization of the storage layer 13 storing the magnetization direction is stabilized, so that the data retention characteristics of the MTJ element can be improved. Moreover, the thermal endurance of the MTJ element 10 can be improved.

Furthermore, by using the RuX alloy as the spacer layer 17, the exchange coupling magnetic field Hex can be prevent from decreasing, even when annealing is performed at a high temperature in the MTJ element 10.

Second Embodiment

In the first embodiment described above, the MTJ element includes the reference layer 16 above the tunnel barrier layer 14 and the storage layer 13 below the tunnel barrier layer 14. The second embodiment is a configuration example of an MTJ element, in which a storage layer 13 is provided above a tunnel barrier layer 14 and a reference layer 16 is provided below the tunnel barrier layer 14.

FIG. 6 is a cross-sectional view of an MTJ element 10 according to the second embodiment. The MTJ element 10 includes a buffer layer (BL) 11, an underlying (UL) layer 12, a shift cancelling layer (SCL) 18, a spacer layer 17, the reference layer (RL) 16, an interface layer (IL) 15, a tunnel barrier layer (TB) 14, the storage layer (SL) 13, and a cap layer (Cap) 19, which are layered in this order from bottom to top.

In the structure shown in FIG. 6, the material composition described above in the first embodiment is applicable to a configuration marked with the same symbol as that used for the corresponding configuration of the first embodiment.

The second embodiment can produce the same effect as the first embodiment.

Third Embodiment

Figure 7:
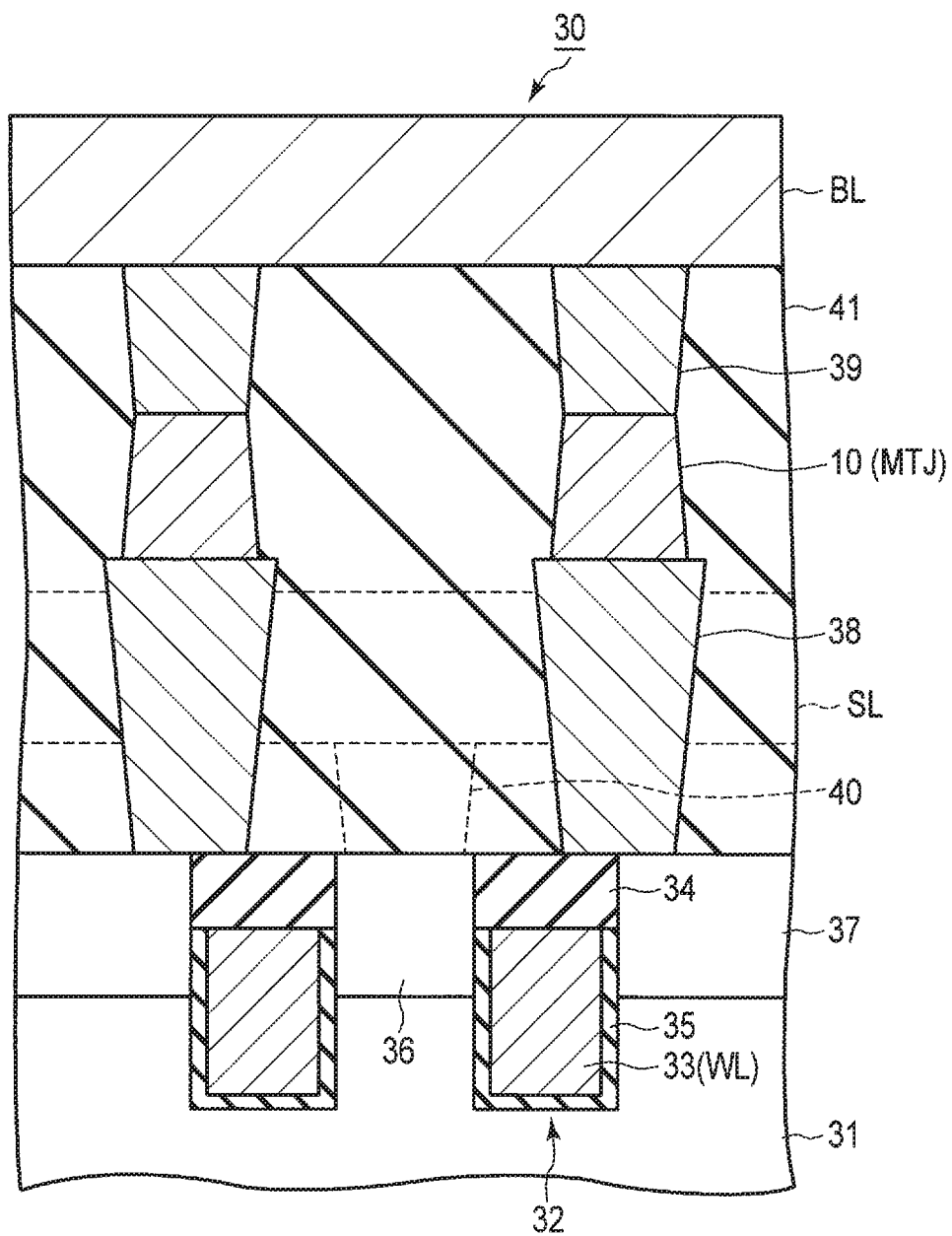
FIG. 7 is a cross-sectional view of an MRAM according to a third embodiment.

The third embodiment is a configuration example of a magnetic storage device (magnetic memory) using the MTJ element 10 of the first or second embodiment described above, namely, a magnetoresistive random access memory (MRAM). FIG. 7 is a cross-sectional view of an MRAM 30 according to the third embodiment.

A semiconductor substrate 31 is formed of a p-type semiconductor substrate. The p-type semiconductor substrate 31 may be a p-type semiconductor region (p-type well) provided in a semiconductor substrate.

A select transistor 32 is provided in the semiconductor substrate 31. The select transistor 32 is formed of a MOS transistor having, for example, a buried gate structure. The select transistor 32 is not limited to a buried gate-type MOS transistor, but may be a planar-type MOS transistor.

The select transistor 32 includes a gate electrode 33, a cap layer 34, a gate insulating film 35, a source region 36, and a drain region 37. The gate electrode 33 functions as a word line WL.

The gate electrode 33 extends in a row direction, and is buried in the semiconductor substrate 31. An upper surface of the gate electrode 33 is lower than an upper surface of the semiconductor substrate 31. The cap layer 34 made of an insulation material is provided above the gate electrode 33. The gate insulating film 35 is provided on a bottom surface and side surfaces of the gate electrode 33. The source region 36 and the drain region 37 are provided in the semiconductor substrate 31 on both sides of the gate electrode 33. The source region 36 and the drain region 37 are made of $N^+$-type impurity diffusion regions formed by introducing a high-concentration N-type impurity into the semiconductor substrate 31.

A pillar-shaped lower electrode 38 is provided on the drain region 37, and an MTJ element 10 is provided on the lower electrode 38. A pillar-shaped upper electrode 39 is provided on the MTJ element 10. A bit line BL extending in a column direction crossing the row direction is provided on the upper electrode 39.

A contact plug 40 is provided on the source region 36. A source line SL extending in the column direction is provided on the contact plug 40. The source line SL is formed of, for example, a wiring layer lower than the bit line BL. An interlayer insulating layer 41 is provided between the semiconductor substrate 31 and the bit line BL.

According to the second embodiment, the MRAM can be formed by using the MTJ element 10 of the first embodiment. Furthermore, the second embodiment can provide a MRAM having excellent data retention characteristics and high thermal endurance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
    a first magnetic layer having a magnetization direction that is variable;
    a second magnetic layer having a magnetization direction that is invariable;
    a first non-magnetic layer provided between the first magnetic layer and the second magnetic layer;
    a third magnetic layer that fixes the magnetization direction of the second magnetic layer and that antiferromagnetically couples with the second magnetic layer; and
    a second non-magnetic layer provided between the second magnetic layer and the third magnetic layer,
    wherein:
    the second non-magnetic layer includes ruthenium (Ru) and a metal element; and
    the metal element is selected from the group consisting of osmium (Os), rhodium (Rh), palladium (Pd), iridium (Ir), platinum (Pt), chromium (Cr), tungsten (W), tantalum (Ta), niobium (Nb), and molybdenum (Mo).

2. The magnetoresistive element of claim 1, wherein the magnetization direction of the second magnetic layer and the third magnetic layer is perpendicular to a film surface.

3. The magnetoresistive element of claim 1, wherein:
    an exchange coupling magnetic field between the second magnetic layer and the third magnetic layer via the second non-magnetic layer has a first characteristic of a waveform that becomes smaller as a thickness of the second non-magnetic layer increases;
    the first characteristic has a first peak where the exchange coupling magnetic field is largest; and
    the second non-magnetic layer is set to a thickness corresponding to the first peak.

4. The magnetoresistive element of claim 1, wherein:
    an exchange coupling magnetic field in a case of using ruthenium (Ru) as a non-magnetic layer of a synthetic antiferromagnetic (SAF) structure has a second characteristic of a waveform that becomes smaller as a thickness of the non-magnetic layer increases;
    the second characteristic has a first peak where the exchange coupling magnetic field is largest, and a second peak where the exchange coupling magnetic field is second largest; and
    a thickness of the second non-magnetic layer is greater than a thickness corresponding to the first peak and smaller than a thickness corresponding to the second peak.

5. The magnetoresistive element of claim 1, wherein the second magnetic layer includes iron (Fe) and boron (B).

6. The magnetoresistive element of claim 1, wherein the third magnetic layer includes iron (Fe) and boron (B).

7. The magnetoresistive element of claim 1, wherein the first non-magnetic layer includes magnesium oxide (MgO).

8. The magnetoresistive element of claim 1, wherein the first magnetic layer includes iron (Fe) and boron (B).

9. The magnetoresistive element of claim 1, wherein the second magnetic layer, the second non-magnetic layer, and the third magnetic layer form a synthetic antiferromagnetic (SAF) structure.

10. A magnetic memory comprising the magnetoresistive element of claim 1.

11. The magnetic memory of claim 10, further comprising a select transistor that is connected to one end of the magnetoresistive element.

12. The magnetic memory of claim 11, further comprising:
    a bit line connected to another end of the magnetoresistive element; and
    a source line connected to one end of the select transistor.

13. A magnetoresistive element comprising:
    a first magnetic layer having a magnetization direction that is variable;
    a second magnetic layer having a magnetization direction that is invariable;
    a first non-magnetic layer provided between the first magnetic layer and the second magnetic layer;
    a third magnetic layer that fixes the magnetization direction of the second magnetic layer and that antiferromagnetically couples with the second magnetic layer; and
    a second non-magnetic layer provided between the second magnetic layer and the third magnetic layer,
    wherein:
    the second non-magnetic layer includes ruthenium (Ru) and a metal element;
    the metal element is selected from the group consisting of osmium (Os), rhodium (Rh), palladium (Pd), iridium (Ir), platinum (Pt), chromium (Cr), tungsten (W), tantalum (Ta), niobium (Nb), and molybdenum (Mo); and
    the metal element is included in the second non-magnetic layer at a composition equal to or less than 30 atomic %.

* * * * *